United States Patent
Mohajeri et al.

(10) Patent No.: US 9,203,418 B2
(45) Date of Patent: Dec. 1, 2015

(54) PHASE LOCKED LOOP CIRCUIT

(71) Applicants: Hessam Mohajeri, Los Altos Hills, CA (US); Bruno Tourette, Cupertino, CA (US)

(72) Inventors: Hessam Mohajeri, Los Altos Hills, CA (US); Bruno Tourette, Cupertino, CA (US)

(73) Assignee: Ensphere Solutions, Inc., Santa Clara, CA (US)

( * ) Notice: Subject to any disclaimer, the term of this patent is extended or adjusted under 35 U.S.C. 154(b) by 8 days.

(21) Appl. No.: 14/244,400

(22) Filed: Apr. 3, 2014

(65) Prior Publication Data

US 2014/0292388 A1 Oct. 2, 2014

Related U.S. Application Data

(62) Division of application No. 13/829,759, filed on Mar. 14, 2013, now Pat. No. 8,786,337.

(60) Provisional application No. 61/646,832, filed on May 14, 2012.

(51) Int. Cl.
| | |
|---|---|
| H03L 7/06 | (2006.01) |
| H03L 7/107 | (2006.01) |
| H03L 7/081 | (2006.01) |
| H03L 7/197 | (2006.01) |
| H03L 7/23 | (2006.01) |

(52) U.S. Cl.
CPC ............ H03L 7/1075 (2013.01); H03L 7/0814 (2013.01); H03L 7/1976 (2013.01); H03L 7/235 (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,538,516 B2 * | 3/2003 | Lenk ................... | 331/2 |
| 6,901,127 B1 * | 5/2005 | Margules ............ | 375/361 |
| 7,702,058 B2 * | 4/2010 | Margules ............ | 375/376 |
| 8,497,716 B2 * | 7/2013 | Zhang ................. | 327/156 |
| 2004/0066238 A1 * | 4/2004 | Dickmann ........... | 331/16 |
| 2005/0105662 A1 * | 5/2005 | Margules ............ | 375/376 |
| 2005/0213693 A1 * | 9/2005 | Page ................... | 375/354 |
| 2006/0006918 A1 * | 1/2006 | Saint-Laurent ..... | 327/295 |
| 2009/0232191 A1 * | 9/2009 | Gupta et al. ........ | 375/216 |
| 2011/0099408 A1 * | 4/2011 | Yin et al. ............ | 713/400 |
| 2011/0099410 A1 * | 4/2011 | Yin et al. ............ | 713/503 |
| 2013/0033293 A1 * | 2/2013 | Zhang ................. | 327/156 |
| 2013/0076414 A1 * | 3/2013 | Kato ................... | 327/157 |
| 2013/0156129 A1 * | 6/2013 | Li Puma et al. .... | 375/296 |
| 2013/0257494 A1 * | 10/2013 | Nikaeen et al. .... | 327/156 |
| 2013/0300470 A1 * | 11/2013 | Mohajeri et al. ... | 327/157 |
| 2014/0126656 A1 * | 5/2014 | Chung et al. ....... | 375/259 |

(Continued)

*Primary Examiner* — Adam Houston
(74) *Attorney, Agent, or Firm* — Womble Carlyle Sandridge & Rice, LLP

(57) ABSTRACT

The present disclosure provides a clock generator circuit comprising a master clock generator unit configured to generate a master clock signal, and a plurality of slave phase locked loop units. Each of the plurality of slave phase locked loop units is configured to receive the master clock signal as an input reference signal and a corresponding source clock signal. The slave phase locked loop unit may comprise an inner loop and an outer loop. The inner loop may comprise a frequency synthesizer locked on a master clock signal received from a master clock generator unit, while the outer loop may comprise a binary phase detector, an output of which goes to a loop filter with proportional and integral action, controlling the inner loop frequency value via a sigma delta input.

5 Claims, 7 Drawing Sheets

(56) References Cited

U.S. PATENT DOCUMENTS

| | | | |
|---|---|---|---|
| 2014/0354335 A1* | 12/2014 | Syllaios et al. | 327/157 |
| 2014/0354336 A1* | 12/2014 | Syllaios et al. | 327/157 |
| 2015/0015308 A1* | 1/2015 | Da Dalt | 327/106 |
| 2015/0145486 A1* | 5/2015 | Bizjak et al. | 323/234 |
| 2015/0194975 A1* | 7/2015 | Miaille et al. | 324/76.39 |

* cited by examiner

US 9,203,418 B2

PHASE LOCKED LOOP CIRCUIT

CROSS-REFERENCE TO RELATED APPLICATIONS

This application is a divisional application of, and incorporates herein by reference in its entirety, U.S. patent application Ser. No. 13/829,759, filed on Mar. 14, 2013, which claims benefit and priority under 35 U.S.C. §119 (e) to U.S. Provisional Application No. 61/646,832, filed May 14, 2012, the entire content of which is incorporated herein by reference into the present disclosure.

FIELD

The present disclosure relates generally to apparatuses and methods for low jitter clock generation.

BACKGROUND

Jitter may occur on the output of non-return-to-zero (NRZ) data transmitter at high frequency data-rate, e.g., at or above 5 Gbps. It is preferable to minimize the jitter to reduce its negative impact on the timing margin of the receiver at the other end and the overall link quality.

Many factors contribute to the jitter, for example the source and external factors including but not limited to crosstalk, impedance mismatch, connector non idealities. As the external factors are less controllable, it is desirable to lower the jitter contribution from the source as much as possible. The jitter in the transmitter clock generator signal may be propagated by further jitter generation and jitter transfer, especially when the data is transmitted from a clock data recovery (CDR) or another source with significant noise.

In many conventional systems, it is necessary to have a transmitter clock generator that is configured to filter out the source high frequency jitter and generate a transmit clock signal having a low noise. This is in general accomplished by using a low noise phase locked loop (also referred to as "PLL") with a low bandwidth and a low noise oscillator. The best performances are achieved by using LC oscillators. However, if multiple independent lanes with different data rates must coexist on a same chip, for example as shown in FIG. 1, the necessity of including multiple LC oscillators on a single chip would cause new problems, such as, frequency beating due to noise coupling between inductors. Moreover, higher power and bigger area are required for implementing systems using multiple LC oscillators, compared to the ones using ring oscillators, in order to achieve a satisfactory jitter performance. Therefore, many multiple-lanes designs nevertheless use ring oscillators despite their worst performance in term of noise generation and power trade-off.

SUMMARY

One embodiment of the present disclosure provides a clock generator circuit comprising a master clock generator unit configured to generate a master clock signal, and a plurality of slave phase locked loop units. Each of the plurality of slave phase looked loop units is configured to receive the master clock signal as an input reference signal and a corresponding source clock signal. In some embodiments, each of the plurality of slave phase locked loop units is a dual loop slave phase lock loop unit that comprises an inner loop and an outer loop, and the inner loop comprises a frequency synthesizer locked on the master clock signal received from the master clock generator unit.

Another embodiment of the present disclosure provides a phase locked loop circuit, comprising an inner loop and an outer loop. The inner loop comprises a frequency synthesizer locked on a master clock signal received from a master clock generator unit, while the outer loop comprises a binary phase detector, an output of which goes to a loop filter with proportional and integral action, controlling the inner loop frequency value via a sigma delta input.

Other features and aspects of the present disclosure will become apparent to those skilled in the art upon review of the following detailed description, claims and drawings.

Figure 1:
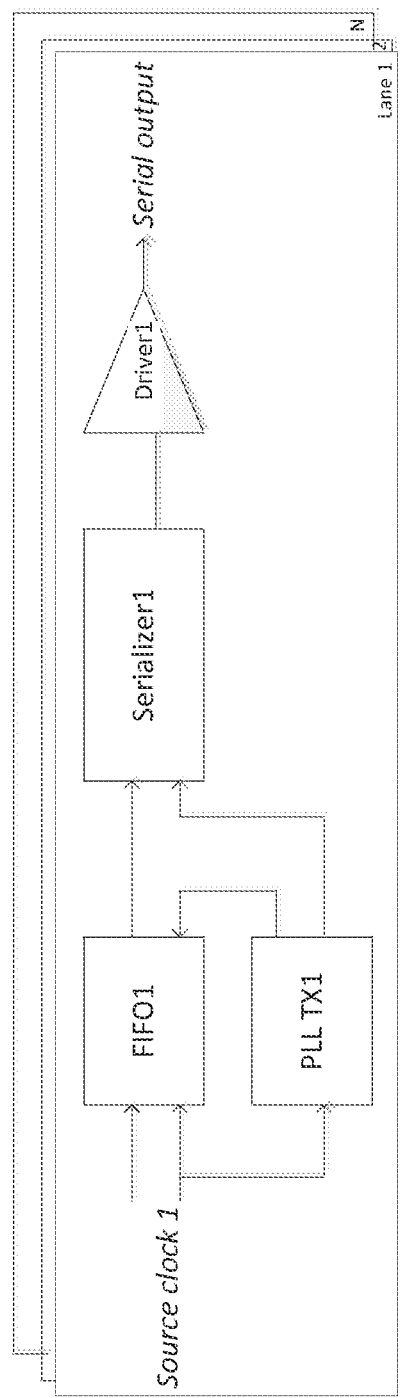
FIG. 1 is a diagram illustrating a multiple lanes transmitter.

Before any features are explained in detail, it is to be understood that the embodiments are not limited in their application to the details of construction and the arrangements of the components set forth in the following description or illustrated in the drawings. The embodiments are capable of being practiced or being carried out in various ways. Also, it is understood that the phraseology and terminology used herein is for the purpose of description and should not be regarded as limiting. The use of "including", "having", and "comprising" and variations thereof herein is meant to encompass the items listed thereafter and equivalents thereof as well as additional items. The use of letters to identify elements of a method or process is simply for identification and is not meant to indicate that the elements should be performed in a particular order.

DETAILED DESCRIPTION

In general, SONET transceivers have the toughest jitter requirements, and conventional SONET transceivers all require the use of multiple LC oscillators (see Werker et al, "A 10-GB/s SONET-Compliant CMOS Transceiver With Low Crosstalk and Intrinsic Jitter", IEEE Journal of solid-state circuits, vol. 39, no. 12, December 2004, which is herein entirely incorporated by reference). As also explained in Heinz Werker et al., the transmitter and receiver are kept independent, but run at the same rate, while crosstalk experiments are usually run with 20 ppm frequency difference between the transmitter and receiver.

For example, as explained in Kenney et al. (Kenney et al., "A 9.95-11.3 Gb/s XFP Transceiver in 0.13 um CMOS," IEEE Journal of solid-state circuits, Vol. 41, No. 12, December 2006, which is herein entirely incorporated by reference.), in order to reduce both jitter generation and jitter transfer, a complex clock recovery circuit implemented can only operate within a very small rate span, and multiple LC oscillators are required. Specifically, two CDRs with the transmission of the retimed data are used for the receiving and transmitting path of XFP transceivers at any rates between 9.95 Gbps to 11.3

Gbps. Kenney et al. uses a feedback with a linear phase shifter, which is not digital, for the proportional path correction.

Other references, including Floyd et al., (Brian A Floyd, "Sub-Integer Frequency Synthesis Using Phase-Rotating Frequency Dividers", IEEE Transactions on circuits and systems-1: regular paper, vol. 55, No. 7, August 2008, which is herein entirely incorporated by reference), U.S. Pat. No. 7,486,145 is herein entirely incorporated by reference, and U.S. Pat. No. 7,162,002 is herein entirely incorporated by reference, describe different uses of phase rotator to create fractional divider. In all of the references, the phase rotators are linear, involving analog, rather than digital, techniques.

Embodiments provide a system of multiple independent Serializer/Deserializer (SerDes) and hi-speed transceiver capable of running at any rates up to 12 Gbps or more.

Figure 2:
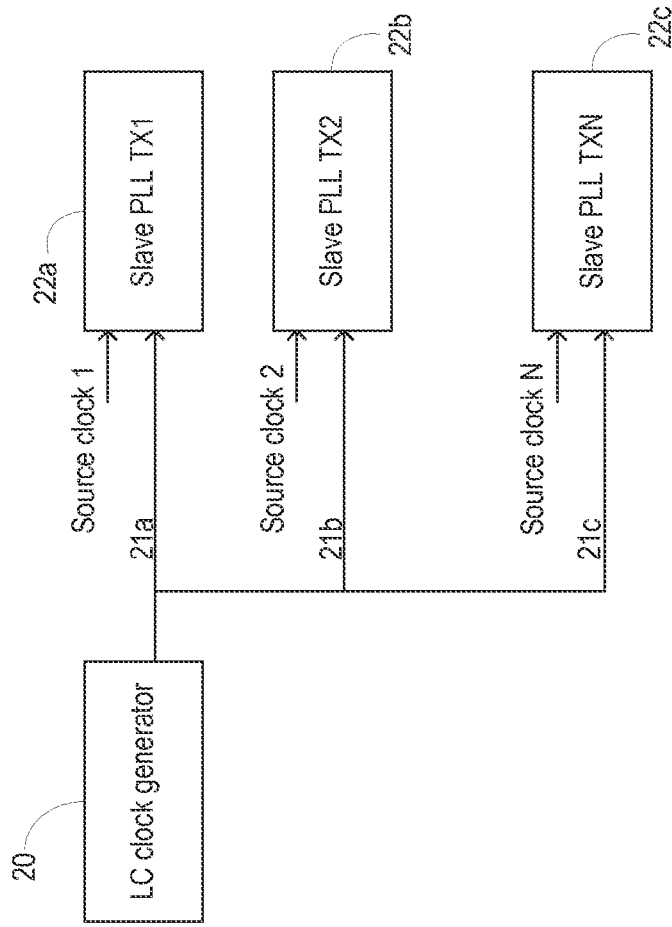
FIG. 2 is a diagram illustrating an exemplary clock generator having multiple slave clock generators according to one embodiment.

In some embodiments, the system comprises a multi-slave PLL configuration, where each slave generates one lane transmit clock from a particular source with performances comparable to a single transmitter using LC VCO in terms of jitter generation and jitter transfer. For example, an architecture illustrated in FIG. 2, also referred to as a "master-slave PLL architecture", may be used. In this embodiment, a low noise reference clock is generated by a central master clock generator 20, and each of the multiple slaves 21 (e.g., slaves 22a, 22b, and 22c, etc.) correspond to a lane TX PLL, respectively. In some embodiments, the master clock generator 20 may be an LC based oscillator with a low phase noise. In some embodiments, each slave PLLs uses a high frequency reference clock (e.g., 21a, 21b, and 21c, etc.) coming from a single low noise LC based voltage-controlled oscillator 20 (referred to as "VCO") of the chip; consequently, multiple LC based VCOs are no longer necessary. Embodiments described above do not require multiple LC based VCOs. Embodiments fail to include multiple LC based VCOs. Embodiments described above can instead include up to one LC based VCOs. Additional embodiments, may be absent a LC based VCO.

In some embodiments, each of the slave PLL 21 may use a dual loop architecture with the main outer loop using only digital PLL techniques. It is therefore possible to implement the system using high density deep submicron CMOS process technologies. In some embodiments, the slave PLL 21 may comprise an additional fractional N synthesizer sub-circuit based on a digital phase rotator that permits sigma delta quantization noise reduction compared to usual fractional N synthesizer.

Figure 3:
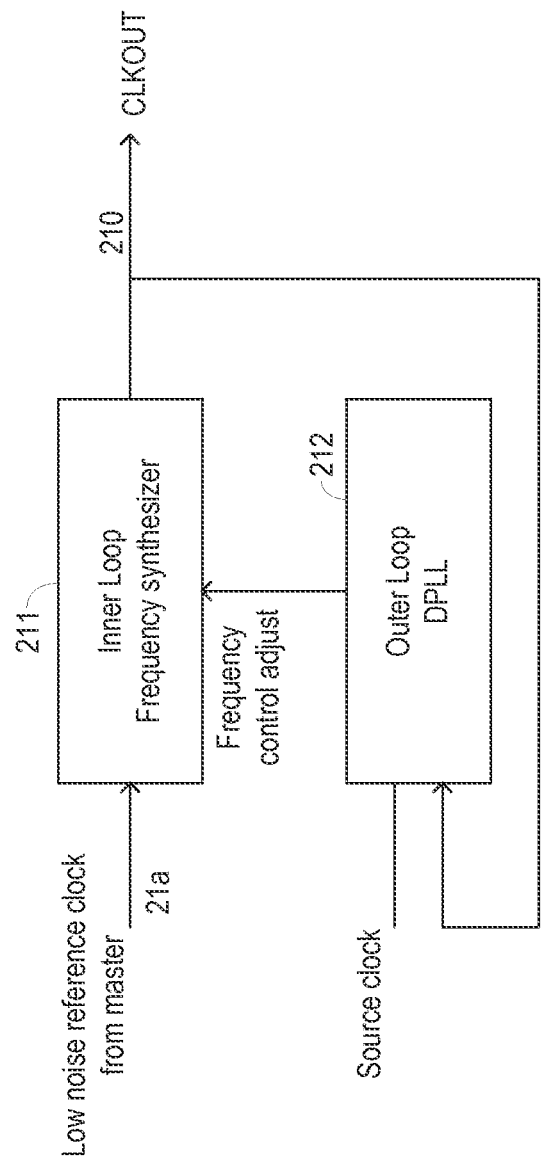
FIG. 3 is a diagram illustrating a dual loop slave PLL according to one embodiment.

In some embodiments, the slave PLL may comprise a dual loop PLL. For example, as illustrated in FIG. 3, the dual loop PLL may comprise a first loop 211 and a second loop 212. The first loop 211 (also referred to as the "inner loop") works as a frequency synthesizer that is locked on the low noise master clock 21a. As the inner loop frequency synthesizer reference clock has low noise, a relatively large bandwidth may be used to filter out the VCO noise. Therefore a less demanding noise constraint on the VCO is achieved, making the use of ring oscillator for the inner loop 211 possible. Each component of the first loop 211 can be implemented or controlled to be digital or analog components. For example, the loop ring oscillator, charge pump and the low pass filter can be implemented to be analog or digital.

The second loop 212 (also referred to as the "outer loop") controls the frequency programming of the inner loop 211 while locking on the reference clock from the data source, e.g., source clock 1. The outer loop 212 may be implemented in its entirety using digital technology and may also be referred to as "DPLL" or "digital PLL." In some embodiments, the outer loop bandwidth can be adjusted to depend on the jitter transfer requirements of the system to sufficiently filter out the jitter from the clock source.

Figure 4:
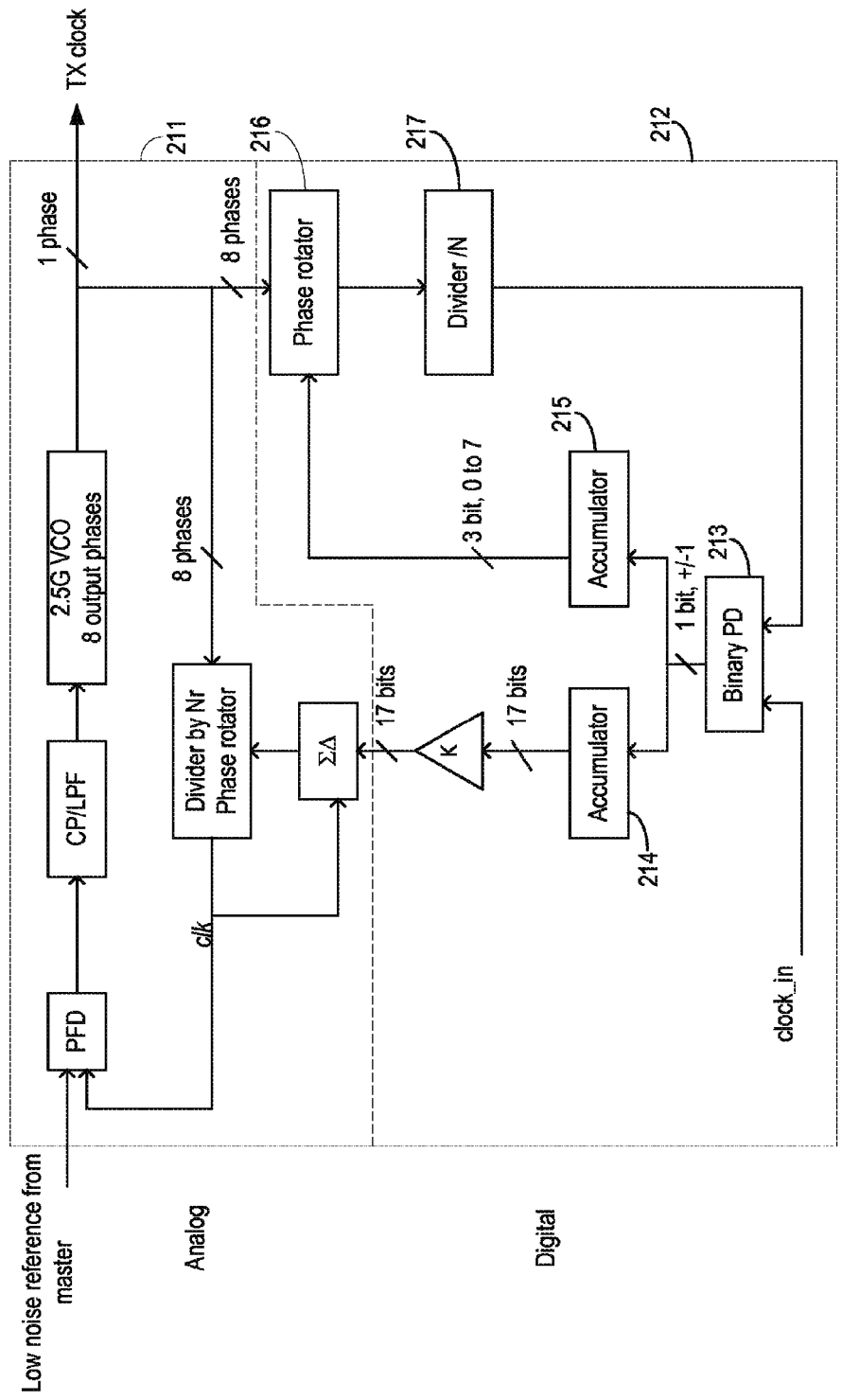
FIG. 4 is a diagram illustrating a dual loop slave PLL architecture according to a non-limiting example.

FIG. 4 illustrates an exemplary slave PLL architecture comprising an inner loop 211 and an outer loop 212. The inner loop frequency synthesizer may comprise a sigma delta fractional N synthesizer. The sigma delta fractional N frequency synthesizer is configured to modulate the feedback divider value using sigma delta modulation to reach accurate fractional division ratios. The inner loop may further comprise a feedback phase rotator, which divides the sigma delta quantization noise by the number of phases used in the phase rotator. Any desirable number of phases, for example 4 to 16 phases or 6 to 12 phase, may be used. For example, in the non-limiting example shown in FIG. 4, eight phases may be used. In some embodiments, a ring oscillator may be used for generating multiple phases signals. One advantage offered by the availability of the multiple phases is that the data may be transmitted at a rate higher than the VCO frequency. For example, in the non-limiting example, the VCO frequency is one quarter of the actual transmitted data rate (also referred to as a quarter rate operation). Such a quarter rate design permits 10 Gbps data transmission, while standard deep submicron CMOS technologies may be used for the system implementation.

In these embodiments, the inner loop 211 generates the TX clock output 210 at a frequency equal to Fmaster*(Nr+Sigma_in/N), where Nr represents the feedback divider ratio, Sigma_in represents the sigma delta modulator input, N represents the total number of phases, and Fmaster represents the master clock frequency.

Figure 5:
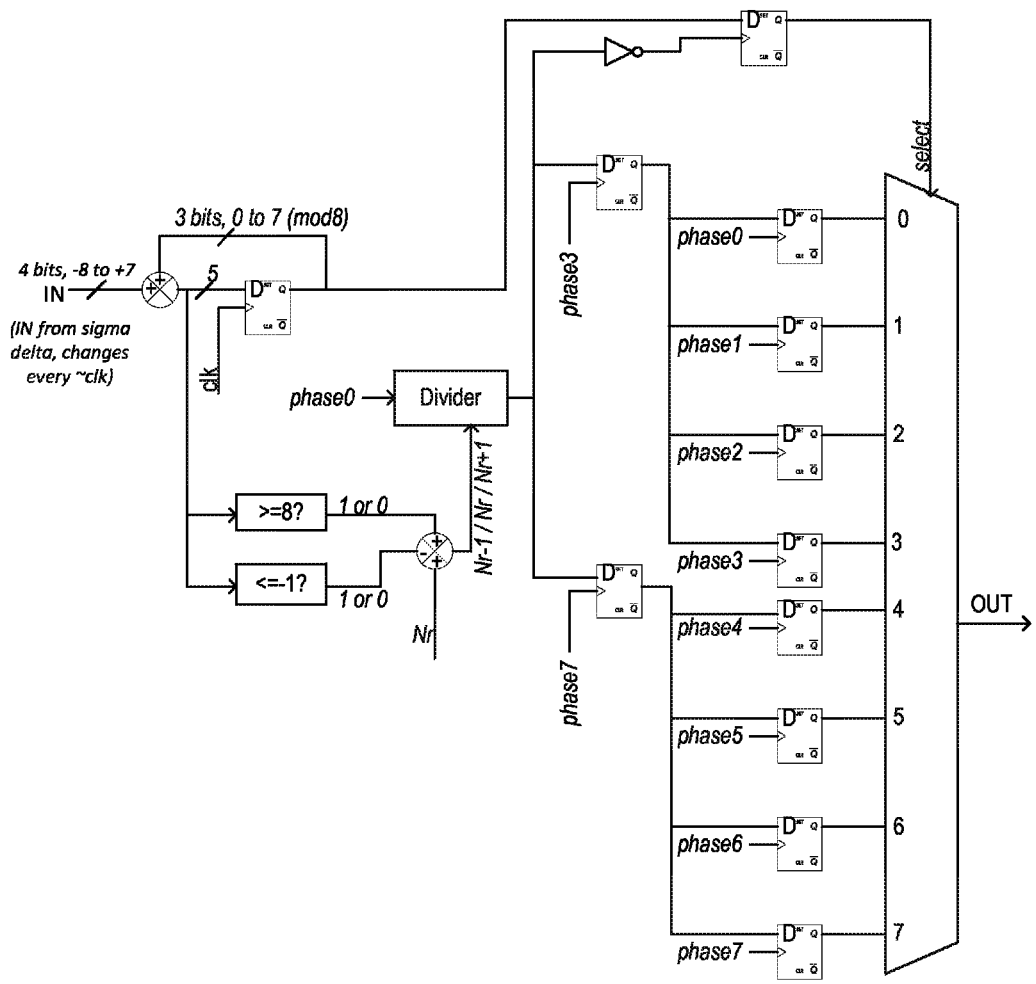
FIG. 5 is a diagram illustrating an inner loop feedback phase rotator according to one embodiment.

Three principal noise contributors to the TX clock output jitter in this inner loop include the noise of the master clock reference, the noise of the VCO, and the noise of the sigma delta modulator used for the frequency adjustment. In some embodiments, the inner loop may include a low pass filter with a cut-off frequency Fc to reduce the input jitter contributed by the master clock reference. As the master clock reference is a low noise reference, the Fc may be relatively high. The inner loop represents a high pass filter with the same cut-off frequency Fc for the noise of the VCO. The Fc has to be high enough to substantially filter out VCO noise in order to meet the system requirements. The quantization noise at the sigma delta modulator output is shaped by the sigma delta modulator and moved towards high frequencies, being small at low frequencies below Fc but increased at higher frequencies. The transfer function of the inner loop for this noise can be achieved by using the low pass filter with cut off frequency Fc. Furthermore, as described previously, the phase rotator may be used to reduce the sigma delta quantization noise by a factor of the number of phases, such as a factor of eight in the non-limiting example illustrated in FIG. 4. For example, as illustrated in FIG. 5, eight equidistant phases from the ring VCO and one divider by Nr may be used to build a phase rotator that is capable of generating a division ratio of Nr+k/8 with k an integer between −7 and 7. By controlling k with a sigma delta modulator instead of Nr, the quantization noise may be reduced by a factor 8. As a result, accurate frequencies equal to Fref*(Nr+frac/8) can be generated, with the number frac being a rational number between −7 and +7 and applied at the input of the sigma delta modulator. The VCO output firstly goes through the divider by Nr. Then, the divider output is "sampled" by each phase, which is performed after synchronization. The outputs of these 8 "samplers" represent the 8 phases of the divided VCO clock. The divider ratio should be greater than 2 so that continuous phase steps may be achieved over the entire divided clock period of the phase selection input that goes to the accumulator. The accumulator output not only provides a phase selection choice (limited to 0 to 7), but also enables a determination on whether or not the group of phase shall to be shifted by +/−1 VCO clock cycle. When such shift is necessary (for example, when accumulator output is greater than 8 or less than 0), the division ratio of the divider shall be changed by +/−1 for one accumulation cycle only.

Referring back to FIG. 4, in some embodiments, the outer loop 212 may comprise or consist in a binary phase detector 213. The binary phase detector 213 is configured to compare the phase of the reference clock from the data source, to which the transmit clock must be locked, with a feedback that is equal to the frequency of the transmit clock. In some embodiments, the binary phase detector 213 may use a single flip flop, while the feedback clock is sampled using the reference clock. The output of this sampler may be used to determine whether the feedback is too fast compared to the reference clock (e.g., when the output equals 1) or too slow (e.g., when the output equals 0).

The output of this phase detector can provide a signal to a loop filter with proportional and integral action, controlling the inner loop frequency value via the sigma delta input. In some embodiments, the integral correction path may comprise or consist in a first accumulator 214 (e.g., a 17 bit accumulator, as shown in FIG. 4) that integrates the phase detector output. This integrator output goes through a gain stage K and further controls the sigma delta input. This coefficient K permits adjustments to the loop bandwidth and speed tracking The proportional correction path may comprise a second accumulator 215 (e.g., a 3 bit accumulator, as shown in FIG. 4) with an output between 0 and 7 that controls a second phase rotator 216. The second phase rotator 216 may be followed by a divider 217. In some embodiments, the second phase rotator 216 and the divider 217 may be introduced between the inner loop VCO multiple phases output and the outer loop binary phase detector input, as illustrated in FIG. 4. The proportional correction makes the outer loop stable, and therefore avoids the necessity of inserting, at the sigma delta input, a high frequency correction signal. Such a high frequency correction signal, if used, would have to be large enough to stabilize the loop, and consequently causes unexpected noise due to disturbance in the sigma delta modulation assuming a very low frequency input.

In this non-limiting example, the second phase rotator 216 can run at the VCO frequency and permit proportional phase correction corresponding to ⅛ of the VCO period per correction cycle, which sufficiently stabilizes the loop. The phase rotator 216 uses the inner loop VCO output phases, and therefore the outer loop feedback signal is still directly related to the transmit clock with an identical frequency when the loop is locked so the transmit clock is consequently locked to the data source reference clock (also referred to as "clock_in").

FIG. 6A-6H show results of a simulation of the above-explained architecture. In this non-limiting example, a VCO frequency of 2.5 GHz, a 250 MHz low noise clock from a master PLL using an LC oscillator, and a reference clock for the data transmission of 240.385 MHz are used. The inner loop bandwidth is about 2 MHz, while the DPLL coefficient K is set to 16 to achieve a lock time of about 16 μs in response to a 10 MHz step of the reference clock. The value of K can be increased to speed up the DPLL response time, or to be decreased to slow it down, depending on the jitter transfer requirements of the system. As shown in FIG. 6, the total resulting jitter on the output 2.4 GHz clock is 6 ps peak to peak.

Figures 6A, 6C, 6E, 6G:
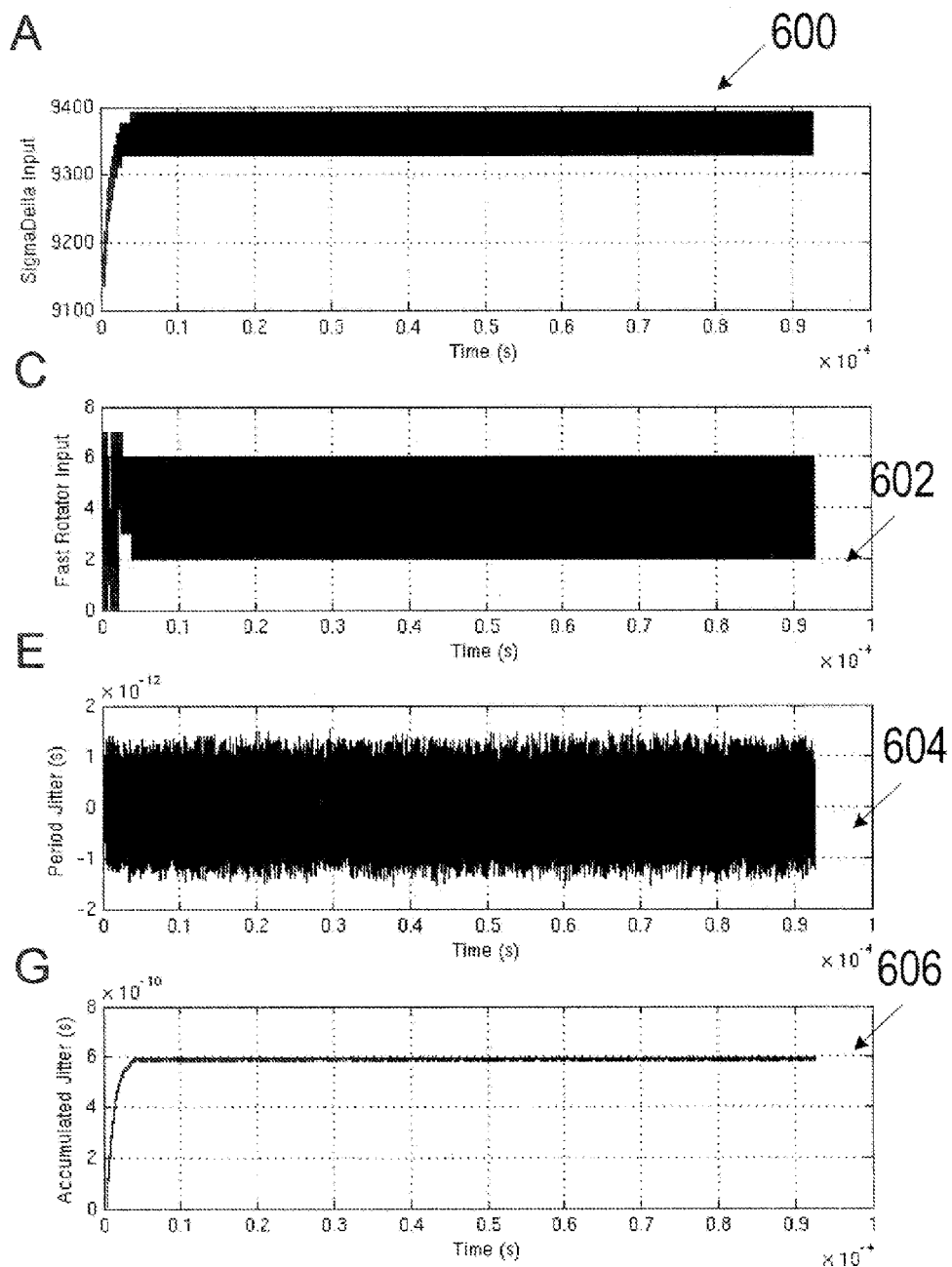
FIG. 6A-H shows simulation results of an exemplary architecture according to one embodiment.

Referring to FIG. 6A, FIG. 6A shows the sigma delta of the 17-bit input code after the accumulator and the gain K are determined (See, FIG. 4). The sigma delta input represents the frequency control adjustment that is created by the outer loop and is applied to the inner loop (See, FIG. 3). The graph 600 shown in FIG. 6A shows the digital loop locking from the initial condition to a steady state. As shown by graph 600, constant corrections can keep the loop locked.

Figures 6B, 6D, 6F, 6H:
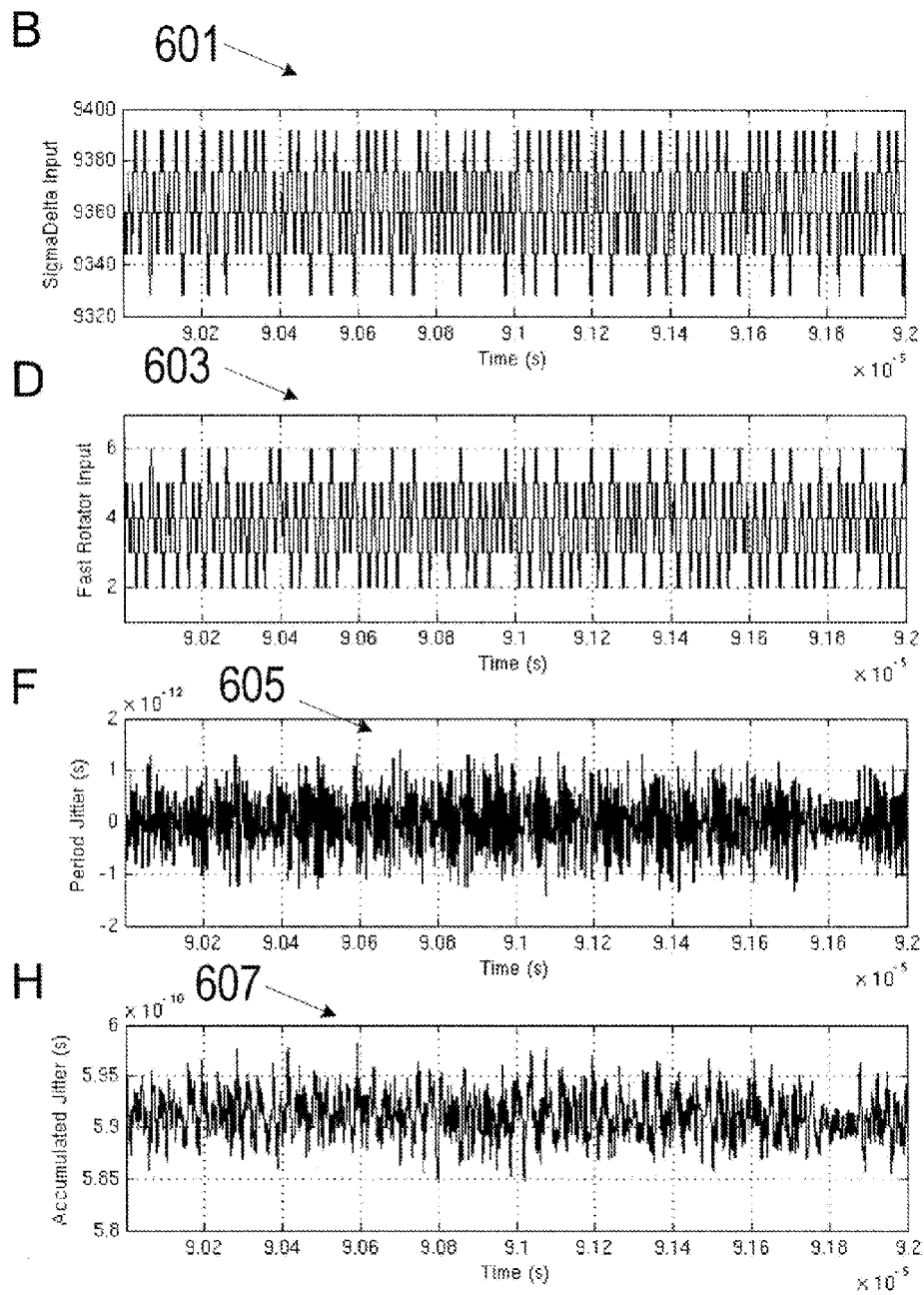

Referring to FIG. 6B, FIG. 6B has a graph 601 that is a zoomed-in version of the result in FIG. 6A in the region where the loop is locked to show the contemporaneous correction compared to the frequency.

FIG. 6C shows graph 602 that shows the sigma delta output which is quantized on 4 bits and control the phase rotator. So between the graphs of FIGS. 6A and 6C we can see the sigma delta operation and the control word at the phase rotator input during locking and then while the output is locked. The graph 603 in FIG. 6D shows an enlarged version of the sigma delta output in the locked region of FIG. 6C.

FIG. 6E has a graph 604 that shows the clock output (TX clock in FIG. 4) cycle to cycle jitter, or variations of the output clock period compared to the target clock period. We can see this jitter being a little over +/−1 ps. FIG. 6F shows a graph 605 that an enlarged version of the graph from FIG. 6E.

FIG. 6G shows a graph 606 that illustrates the accumulated phase error, it is the accumulation of the cycle to cycle jitter from FIGS. 6E and 6F. Graph 606 shows that no phase drift is achievable in less than 0.05 s. The goal is to have no phase drift when the loop is locked and as shown in the graph 605 this is achieved in less than 0.05 s. FIG. 6H shows a graph 607 that is an enlarged version of the graph from FIG. 6G. The graph 607 exhibits a very small phase jitter.

The master slave PLL architectures described above may be used to generate multiple high speed and low jitter clock outputs that are independent from each other. Excellent jitter performances may be obtained on all independent lanes, while only one low noise LC reference clock generator is required. Another advantage of the above-explained system includes using digital techniques, ring oscillator, and eliminating multiple VCOs, and permitting an implementation that uses deep sub micron CMOS technology for data rate transmission above 10 Gbps.

Although the machines and apparatus have been described in detail with reference to certain preferred embodiments, variations and modifications exist within the scope and spirit of the disclosure as described and defined in the following claims.

Those of skill would further appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of non-transitory storage medium known in the art. An exemplary non-transitory storage medium is coupled to the processor such that the processor can read information from, and write information to, the storage medium. In the alternative, the storage medium can be integral to the processor. The processor and the non-transitory storage medium can reside in an ASIC. The ASIC can reside in a user terminal. In the alternative, the processor and the storage medium can reside as discrete components in a user terminal.

In one or more exemplary embodiments, the functions described can be implemented in hardware, software, firmware, or any combination thereof. If implemented in software, the functions can be stored on or transmitted over as one or more instructions or code on a computer-readable medium. Computer-readable media includes both computer storage media and communication media including any medium that facilitates transfer of a computer program from one place to another. Storage media can be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein can be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A phase locked loop circuit, comprising an inner loop and an outer loop, wherein:
   the inner loop comprises a frequency synthesizer locked on a master clock signal received from a master clock generator unit;
   the outer loop comprises a binary phase detector, an output of which goes to a loop filter with proportional and integral action, controlling the inner loop frequency value via a sigma delta input.

2. The phase locked loop circuit of claim 1, wherein the inner loop and outer loop are fully digital or the phase locked loop is fully digital except the inner loop ring oscillator, charge pump and low-pass filter.

3. The phase locked loop circuit of claim 1, wherein a phase rotator followed by a divider connects an inner loop output and a binary phase detector input.

4. The phase locked loop circuit of claim 3, wherein:
   the filter with proportional and integral action comprises an integrator correction accumulator and a proportional correction accumulator;
   the proportional correction accumulator is configured to control the phase rotator;
   the integrator correction accumulator is configured to integrate the phase detector output;
   the integrator output goes through a gain stage K and further controls the sigma delta input.

5. The phase locked loop circuit of claim 4, wherein the gain stage K is configured to permit adjustments to the loop bandwidth and speed tracking.

* * * * *